US011549972B2

(12) United States Patent
Tabuchi et al.

(10) Patent No.: US 11,549,972 B2
(45) Date of Patent: Jan. 10, 2023

(54) VOLTAGE DETECTION CIRCUIT

(71) Applicants: Hitoshi Tabuchi, Isehara (JP); Masaru Hirai, Hadano (JP); Tomiyuki Nagai, Atsugi (JP); Kenya Tokuda, Atsugi (JP)

(72) Inventors: Hitoshi Tabuchi, Isehara (JP); Masaru Hirai, Hadano (JP); Tomiyuki Nagai, Atsugi (JP); Kenya Tokuda, Atsugi (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 161 days.

(21) Appl. No.: 17/187,615

(22) Filed: Feb. 26, 2021

(65) Prior Publication Data

US 2021/0293859 A1     Sep. 23, 2021

(30) Foreign Application Priority Data

Mar. 18, 2020   (JP) .............................. JP2020-047115

(51) Int. Cl.
| | |
|---|---|
| *H02J 7/00* | (2006.01) |
| *G01R 19/165* | (2006.01) |
| *B60L 58/18* | (2019.01) |
| *G01R 15/04* | (2006.01) |

(Continued)

(52) U.S. Cl.
CPC ........ *G01R 19/16542* (2013.01); *B60L 58/18* (2019.02); *G01R 15/04* (2013.01); *G01R 31/36* (2013.01); *H02J 7/0047* (2013.01); *B60L 2240/547* (2013.01); *G01R 19/165* (2013.01); *G01R 31/3835* (2019.01)

(58) Field of Classification Search
CPC ............ G01R 19/16542; G01R 19/165; G01R 31/36; G01R 31/3835; G01R 15/04; H02J 7/0047; B60L 2240/547; B60L 58/18

USPC ......................................................... 324/426
See application file for complete search history.

(56) References Cited

U.S. PATENT DOCUMENTS

| | | | |
|---|---|---|---|
| 2006/0220461 A1 | 10/2006 | Miyamoto | |
| 2007/0108949 A1* | 5/2007 | Ohoka | .................... G05F 1/573 |
| | | | 323/271 |
| 2016/0164311 A1* | 6/2016 | Nagata | ................ H02J 7/00714 |
| | | | 320/134 |

FOREIGN PATENT DOCUMENTS

| | | |
|---|---|---|
| JP | 2002357625 A | 12/2002 |
| JP | 2006275928 A | 10/2006 |

* cited by examiner

*Primary Examiner* — Zixuan Zhou
(74) *Attorney, Agent, or Firm* — Holtz, Holtz & Volek PC

(57) ABSTRACT

A voltage detection circuit including a voltage input terminal, a voltage dividing circuit, a voltage comparison circuit, an output terminal, a detection voltage adjustment terminal, a voltage-current conversion circuit, and a constant current source. A voltage to be monitored is input to the voltage input terminal. The voltage dividing circuit includes series resistors between the voltage input terminal and a constant voltage terminal. The voltage comparison circuit compares a voltage divided by the voltage dividing circuit with a predetermined voltage. The comparison result is output from the output terminal. An external resistor is connected to the detection voltage adjustment terminal. The voltage-current conversion circuit is provided between the detection voltage adjustment terminal and the voltage dividing circuit. The constant current source is connected between an internal power supply voltage terminal and the detection voltage adjustment terminal.

4 Claims, 2 Drawing Sheets

(51) Int. Cl.
*G01R 31/36* (2020.01)
*G01R 31/3835* (2019.01)

VOLTAGE DETECTION CIRCUIT

CROSS-REFERENCE TO RELATED APPLICATION

This application is based upon and claims the benefit of priority from the prior Japanese Patent Application No. 2020-047115, filed on Mar. 18, 2020, the entire contents of which are incorporated herein by reference.

BACKGROUND

Technical Field

The present invention relates to a voltage detection circuit that monitors a voltage of a battery or the like and outputs a detection signal when detecting that the voltage becomes over or below a predetermined voltage value. In particular, the present invention relates to a technique effectively used in a semiconductor integrated circuit for detecting a voltage capable of adjusting a detection voltage value with the use of an external terminal.

Background Art

In cases where batteries, such as batteries mounted on vehicles like automobiles and so on, have a voltage fault due to malfunction, consumption, or other cause, the performance of the batteries may be deteriorated, or a power-supplied electronic device may not properly operate. In view of this, a voltage detection circuit is provided that outputs a detection signal when a battery voltage becomes outside a specified range. Specifically, a semiconductor integrated circuit (voltage detection IC) for detecting a voltage is provided as an element or a component having such a function.

Some conventional voltage detection ICs include series resistors $R_{I1}$ and $R_{I2}$, a comparator COMP, and a transistor M1, as shown in FIG. 3. The resistors $R_{I1}$ and $R_{I2}$ divide a voltage of a voltage input terminal VS. The comparator COMP compares the voltage divided by the resistors $R_{I1}$ and $R_{I2}$, with a predetermined reference voltage $V_{REF}$. The transistor M1 is connected between an output terminal OUT and a ground point and has a gate terminal to which an output voltage of the comparator COMP is applied. These voltage detection ICs have a simple configuration with a small number of elements and is thus inexpensive, and moreover, they can produce a detection signal DS in the state where a pull-up resistor $R_{PULL}$ is connected to the output terminal OUT, whereby usability is good.

SUMMARY

In the case of using the voltage detection IC shown in FIG. 3 for detecting a battery voltage, a current that flows in the resistors $R_{I1}$ and $R_{I2}$ is a dark current for a battery, and therefore, the resistors $R_{I1}$ and $R_{I2}$ are normally set to have resistance values of several tens of MΩ. On the other hand, the detection voltage of the voltage detection IC is a fixed value that is determined by a resistance ratio of the resistors $R_{I1}$ and $R_{I2}$ and the reference voltage $V_{REF}$. For this reason, in order to use a voltage value different from the detection voltage specific to the IC, at the stage of designing or studying a system using the voltage detection IC, the detection voltage value is adjusted by connecting external resistors $R_{E1}$ and $R_{E2}$ to the voltage input terminal VS so that a voltage divided by the external resistors $R_{E1}$ and $R_{E2}$ will be input to the voltage input terminal VS, as shown in FIG. 3.

However, if the resistance values of the external resistors $R_{E1}$ and $R_{E2}$ are higher than the resistance values (e.g., several tens of MΩ) of the internal resistors $R_{I1}$ and $R_{I2}$ of the IC, the adjusted detection voltage varies due to variations in the internal resistors $R_{I1}$ and $R_{I2}$. In consideration of this, the resistance values of the external resistors $R_{E1}$ and $R_{E2}$ are normally set to be sufficiently small values (several hundreds of kΩ) compared with the resistance values of the internal resistors $R_{I1}$ and $R_{I2}$. Unfortunately, small resistance values of the external resistors $R_{E1}$ and $R_{E2}$ increase the current flowing in these resistors $R_{E1}$ and $R_{E2}$, resulting in increase in the dark current of the battery. On the other hand, in order to set the detection voltage value as desired without increasing the dark current, multiple voltage detection ICs for different detection voltage values should be prepared in advance. This increases man-hours for evaluation and complicates inventory management.

Conventional techniques relating to a voltage detection circuit for detecting an abnormal voltage of a battery are disclosed in, for example, JP 2002-357625A and JP 2006-275928A. However, JP 2002-357625A and JP 2006-275928A fail to disclose a technique of making the detection voltage value adjustable by connecting the external resistors $R_{E1}$ and $R_{E2}$ to the voltage detection circuit disclosed therein.

The present invention has been achieved in view of the above-described problems, and an object thereof is to provide a voltage detection circuit having an external resistor that enables adjusting a detection voltage value without increasing dark current of a battery when used in detecting a battery voltage.

Moreover, another object of the present invention is to provide a voltage detection circuit that detects a voltage value with high accuracy.

According to an aspect of the present invention, there is provided a voltage detection circuit including: a voltage input terminal to which a voltage of a monitoring target is input; a voltage dividing circuit that includes series resistors connected between the voltage input terminal and a constant voltage terminal; a voltage comparison circuit that compares a voltage divided by the voltage dividing circuit with a predetermined voltage; an output terminal from which a result of comparison by the voltage comparison circuit is output; a detection voltage adjustment terminal to which an external resistor is connected; a voltage-current conversion circuit that is provided between the detection voltage adjustment terminal and the voltage dividing circuit; and a constant current source that is connected between an internal power supply voltage terminal and the detection voltage adjustment terminal, wherein the voltage detection circuit is a semiconductor integrated circuit formed on a semiconductor substrate, and the voltage detection circuit detects that a voltage input to the voltage input terminal becomes over or below a predetermined voltage value and outputs a signal from the output terminal, and a detection voltage of the voltage input terminal is adjusted by the voltage-current conversion circuit drawing an electric current corresponding to a resistance value of the external resistor, which is connected to the detection voltage adjustment terminal, from a connection node between the series resistors of the voltage dividing circuit.

BRIEF DESCRIPTION OF THE DRAWINGS

The accompanying drawings are not intended as a definition of the limits of the invention but illustrate embodiments of the invention, and together with the general description given above and the detailed description of the embodiments given below, serve to explain the principles of the invention, wherein.

DESCRIPTION OF EMBODIMENTS

Hereinafter, an embodiment of the present invention will be described in detail with reference to the drawings.

Figure 1:
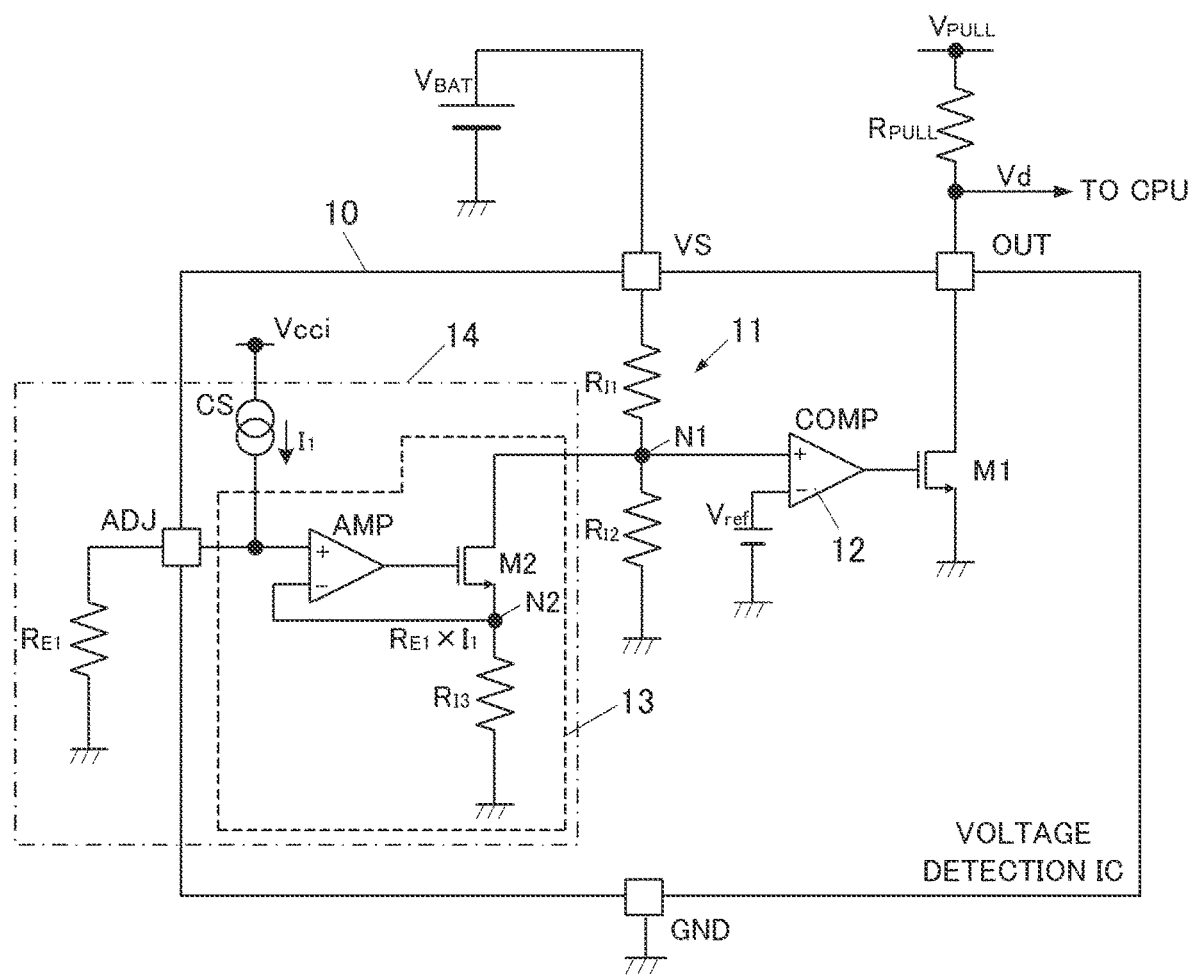
FIG. 1 is a circuit configuration diagram showing an embodiment of a voltage detection circuit of the present invention.

FIG. 1 is a circuit diagram showing a voltage detection circuit according to an embodiment of the present invention. Note that, in a voltage detection circuit 10 in FIG. 1, circuit elements in a range enclosed by a solid-line frame with a reference sign 10 are formed on one semiconductor substrate or semiconductor chip as a semiconductor integrated circuit (battery voltage detection IC), but the structure is not limited thereto.

The voltage detection circuit 10 according to this embodiment includes a voltage input terminal VS, an output terminal OUT, a detection voltage adjustment terminal ADJ, and a ground terminal GND. To the voltage input terminal VS, there is applied a power supply voltage $V_{BAT}$ from a battery 20 being a voltage detection target. The output terminal OUT is a terminal for outputting a detection signal Vd to an external controller (CPU). The detection voltage adjustment terminal ADJ is used to adjust the detection voltage from the outside. The ground terminal GND is a constant voltage terminal to which a ground potential is applied. The battery 20 being a voltage detection target may be a vehicle mounted battery, for example. In this case, the voltage detection circuit 10 is mounted on a circuit board or the like to be mounted on a vehicle.

The voltage detection circuit 10 also includes a voltage dividing circuit 11 and a voltage comparison circuit (comparator: COMP) 12. The voltage dividing circuit 11 is configured by including resistors $R_{r1}$ and $R_{r2}$ that are connected in series between the voltage input terminal VS and a ground point. The voltage comparison circuit 12 compares a voltage divided by the voltage dividing circuit 11 with a predetermined reference voltage $V_{REF}$.

Herein, the resistors $R_{r1}$ and $R_{r2}$ are set to have resistance values of several tens of MΩ so that a small electric current of approximately several µA flows therein. In addition, the reference voltage $V_{REF}$ is set to a value of, for example, 1V.

The voltage detection circuit 10 of this embodiment further includes a MOS transistor M1, a voltage-current conversion circuit 13, and a constant current source CS for setting the detection voltage. The MOS transistor M1 is connected between the output terminal OUT and the ground point (GND). The voltage-current conversion circuit 13 is connected to the detection voltage adjustment terminal ADJ to convert the voltage of the detection voltage adjustment terminal ADJ into current. The constant current source CS for setting the detection voltage is connected between an internal power supply voltage terminal Vcci of the IC and the detection voltage adjustment terminal ADJ. The constant current source CS is designed to flow a current $I_1$ of, for example, 1 µA. A resistor $R_{E1}$ is connected between the detection voltage adjustment terminal ADJ and a ground point, as an external resistor for adjustment.

The voltage-current conversion circuit 13 includes a differential amplifier (differential amplifier circuit) AMP, a MOS transistor M2, and a resistor $R_{r3}$. The differential amplifier AMP has a non-inverting input terminal connected to the detection voltage adjustment terminal ADJ. The MOS transistor M2 and the resistor $R_{r3}$ are connected in series between a ground point and a connection node N1 between the resistors $R_{r1}$ and $R_{r2}$ of the voltage dividing circuit 11. The MOS transistor M2 and the resistor $R_{r3}$ are connected in such a manner that the potential at a connection node N2 between the MOS transistor M2 and the resistor $R_{r3}$ is fed back to an inverting input terminal of the differential amplifier AMP. The voltage-current conversion circuit 13, the constant current source CS, and the resistor $R_{E1}$ for adjustment (adjustment resistor $R_{E1}$) constitute a detection voltage adjustment circuit 14.

Moreover, in the voltage detection circuit 10 of this embodiment, a current-voltage converting pull-up resistor $R_{PULL}$ is connected between the output terminal OUT and a power supply voltage terminal $V_{PULL}$ of an external system.

An output voltage of the voltage comparison circuit 12 is applied to the gate terminal of the MOS transistor M1. When the voltage that is divided by the voltage dividing circuit 11 becomes higher than the reference voltage $V_{REF}$, the output voltage of the voltage comparison circuit 12 becomes a low level, and the MOS transistor M1 is turned off accordingly. Then, the current flowing in the pull-up resistor $R_{PULL}$ is shut off, and the voltage of the output terminal OUT is changed from a low level to a high level ($V_{PULL}$). This voltage is supplied to a controller (CPU) which is not shown, as a detection signal Vd.

As a result, the controller (CPU) receiving the detection signal Vd can recognize that a battery voltage $V_{BAT}$ has reached a predetermined voltage value, for example, during charging the battery 20.

In contrast, when the battery voltage $V_{BAT}$ becomes equal to or lower than the predetermined voltage value due to discharge of the battery 20, the output voltage of the voltage comparison circuit 12 becomes a low level, and the MOS transistor M1 is turned off accordingly. Then, current flows in the pull-up resistor $R_{PULL}$, and the voltage of the output terminal OUT is changed from a high level to a low level. As a result, the controller (CPU), which is not shown, can recognize that the voltage $V_{BAT}$ of the battery 20 has decreased to the predetermined voltage value or lower.

Next, the function and operation of the detection voltage adjustment circuit 14 will be described.

The detection voltage adjustment circuit 14 draws a current from the connection node N1 between the resistors $R_{r1}$ and $R_{r2}$ constituting the voltage dividing circuit 11, to adjust the potential of the connection node N1. This enables changing the voltage that is detected by the voltage comparison circuit 12. Specifically, the resistance value of the adjustment resistor $R_{E1}$, which is externally connected to the detection voltage adjustment terminal ADJ, is varied to adjust the current drawn from the connection node N1. This varies the potential at the connection node N1, resulting in change in the voltage that is detected by the voltage comparison circuit 12.

In addition, it is possible to make the detection voltage adjustment circuit 14 of this embodiment invisible from the voltage comparison circuit 12 side by dropping the potential of the detection voltage adjustment terminal ADJ to ground potential (0V). Specifically, in the state where the detection voltage adjustment terminal ADJ has ground potential, the output of the differential amplifier AMP is the ground potential, and the MOS transistor M2 is turned off accordingly. Thus, no current is drawn from the connection node N1 between the resistors $R_{I1}$ and $R_{I2}$ constituting the voltage dividing circuit 11, which thus leads to the operation at the detection voltage similar to that in a circuit (for example, refer to FIG. 3) without the detection voltage adjustment circuit 14.

That is, in this case, the detection voltage $V_{DET}$ is a potential represented by the following formula (1):

$$V_{DET}=V_{REF}\times(R_{I1}+R_{I2})/R_{I2} \quad (1)$$

On the other hand, in the case where the adjustment resistor $R_{E1}$ is connected to the detection voltage adjustment terminal ADJ, due to the effect of the imaginary short of the differential amplifier AMP, the MOS transistor M2 is driven so that the potential at the connection node N2 between the MOS transistor M2 and the resistor $R_{I3}$ matches the potential ($R_{E1}\times I_1$) of the detection voltage adjustment terminal ADJ.

As a result, the detection voltage $V_{DET}'$ in this case is a potential represented by the following formula (2):

$$V_{DET}'=V_{DET}+(R_{I1}/R_{I3})\times R_{E1}\times I_1 \quad (2)$$

The formula (2) shows that the detection voltage $V_{DET}'$ can be adjusted by changing the resistance value of the adjustment resistor $R_{E1}$.

Meanwhile, the formula (2) also shows that variations in the resistance values of the resistors $R_{I1}$ and $R_{I3}$ cause the detection voltage $V_{DET}'$ to be changed. However, in the case where the voltage detection circuit 10 is an IC, the resistors $R_{I1}$ and $R_{I3}$, which are on-chip elements, vary similarly to each other when their resistance values vary due to a production process. Thus, the variation in $R_{I1}/R_{I3}$ as a resistance ratio can be small. In view of this, use of a highly accurate element as the adjustment resistor $R_{E1}$ to be connected to the detection voltage adjustment terminal ADJ enables reducing the variation in the detection voltage $V_{DET}'$.

In this embodiment, the current that flows in the adjustment resistor $R_{E1}$ is such a small current $I_1$ as 1 μA, which is provided from the constant current source CS. This can reduce the dark current flowing out from the battery 20 due to the connection with the adjustment resistor $R_{E1}$, to be smaller than that in a conventional circuit shown in FIG. 3.

Figure 3:
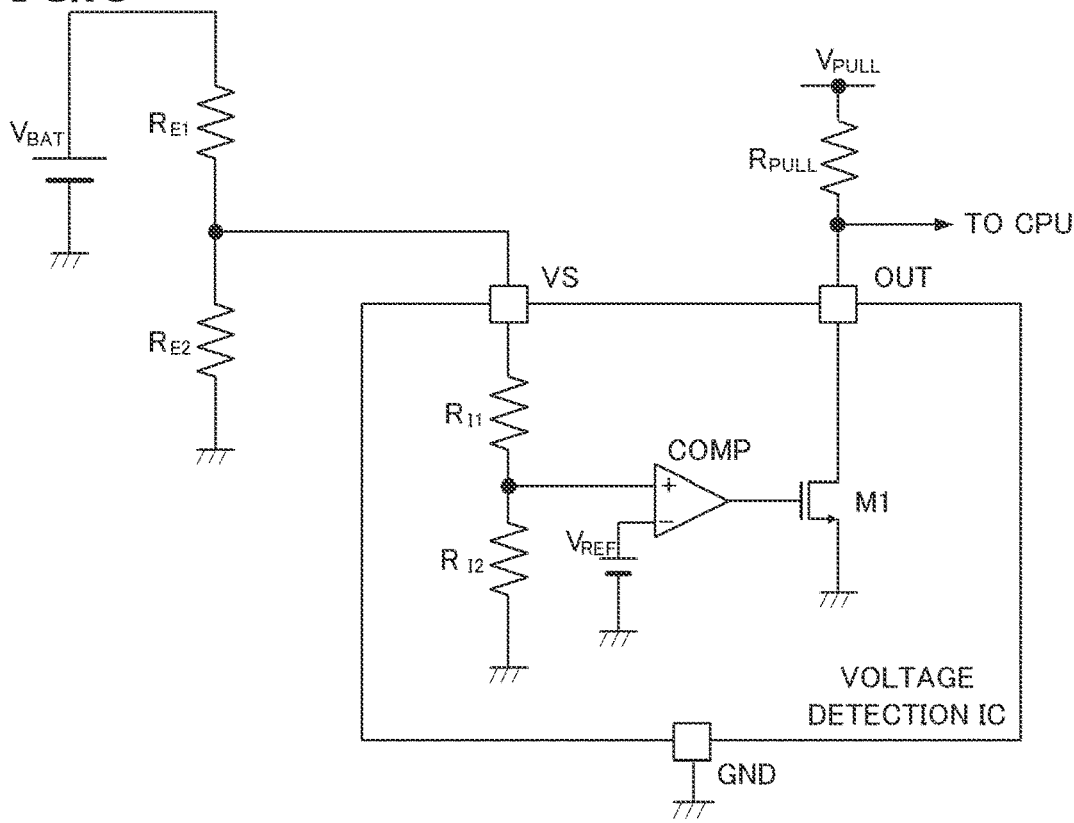
FIG. 3 is a circuit configuration diagram showing an example of a conventional voltage detection circuit.

Specifically, in the state where the resistance values of the external resistors $R_{E1}$ and $R_{E2}$ are set to several hundreds of kΩ in the conventional circuit in FIG. 3, the current flowing in the resistors $R_{E1}$ and $R_{E2}$ is of the order of 100 μA. In this point, in the voltage detection circuit 10 of this embodiment, since the current that flows in the external resistor $R_{E1}$ is such a small current $I_1$ as 1 μA, which is provided from the constant current source CS, the dark current can be reduced to approximately 1/100 of that in the conventional circuit.

Meanwhile, in the voltage detection circuit 10 of the above-described embodiment, the addition of the voltage-current conversion circuit 13 increases the current consumed in the voltage detection circuit 10 more than that in the conventional circuit. However, the differential amplifier AMP can be designed so that the operating current of the differential amplifier AMP constituting the voltage-current conversion circuit 13 will be not more than 1 μA by the current semiconductor integrated circuit manufacturing technology. That is, the increase in electric consumption is only approximately 2 μA in total including the current $I_1$ (1 μA) due to the constant current source CS. Thus, it is possible to greatly reduce, in total, the dark current flowing out from the battery 20, to be smaller than that in the conventional circuit in FIG. 3.

As described above, in the voltage detection circuit 10 in the above-described embodiment, providing the detection voltage adjustment circuit 14 enables adjusting the detection voltage. In addition, although the detection voltage adjusting function is added, a small current flows in the external resistor for adjusting the detection voltage, whereby increase in the dark current can be suppressed, resulting in long life of the battery. Meanwhile, the effect of variations in the internal resistors on the detection voltage is suppressed, and therefore, the voltage can be detected with high accuracy. Moreover, the voltage adjusting function is easily disabled only by performing a wiring process so that the ground potential will be applied to the detection voltage adjustment terminal ADJ, whereby usability is good.

In the conventional technique shown in FIG. 3, in order to adjust the detection voltage without increasing the dark current, a voltage detection IC should be manufactured by changing the design of the IC, which requires lead times to change the design and manufacture experimentally. On the other hand, the voltage detection IC of the above-described embodiment can reduce a lead time. In addition, in the conventional technique, an IC should be prepared for each detection voltage, which causes increase in man-hours for evaluation and complication of inventory management. On the other hand, the voltage detection IC of the above-described embodiment can reduce these problems.

Modification Example

Next, a modification example of the voltage detection circuit 10 of the above-described embodiment will be described by using FIG. 2.

Figure 2:
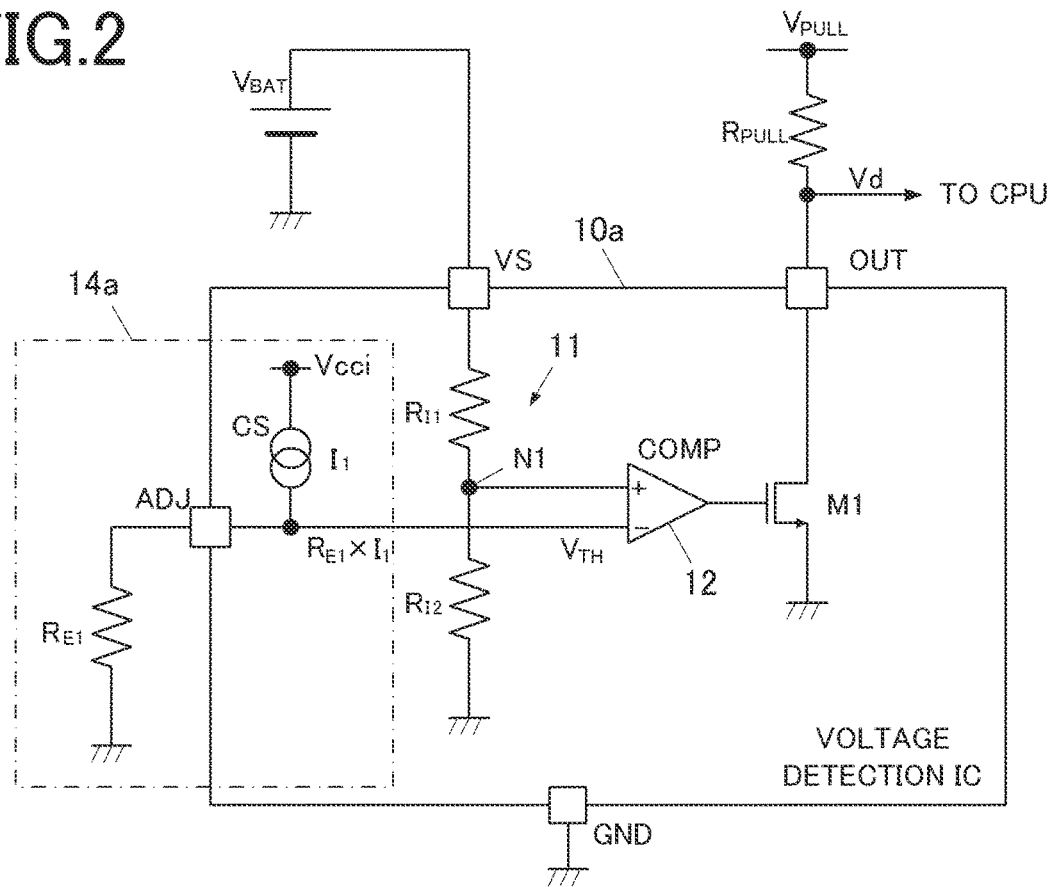
FIG. 2 is a circuit configuration diagram showing a modification example of the voltage detection circuit of the embodiment.

In a voltage detection circuit 10a as a modification example shown in FIG. 2, the voltage-current conversion circuit 13 in the above-described embodiment is omitted. A detection voltage adjustment circuit 14a is configured by including the constant current source CS for setting the detection voltage and the adjustment resistor $R_{E1}$ that is connected to the detection voltage adjustment terminal ADJ. The voltage that is current-voltage converted by the adjustment resistor $R_{E1}$ is applied to the inverting input terminal of the comparator (COMP) 12, as a comparison voltage $V_{TH}$.

In the voltage detection circuit 10a of this modification example, the detection voltage $V_{DET}'$ is a potential represented by the following formula (3):

$$V_{DET}'=V_{REF}=R_{E1}\times I_1\times(R_{I1}+R_{I2})/R_{I2} \quad (3)$$

The formula (3) shows that the detection voltage $V_{DET}'$ can be adjusted by changing the resistance value of the external adjustment resistor $R_{E1}$.

In addition, in the voltage detection circuit 10a of this modification example, the detection voltage $V_{DET}'$ can be adjusted in a wide range by using the adjustment resistor $R_{E1}$. Note that, unlike the voltage detection circuit 10 of the above-described embodiment, it is necessary to connect the resistor $R_{E1}$ to the detection voltage adjustment terminal ADJ.

As in the case of the voltage detection circuit 10 of the embodiment in FIG. 1, in the voltage detection circuit 10a of this modification example, the current that flows in the adjustment resistor $R_{E1}$ is such a small current $I_1$ as 1 μA, which is provided by the constant current source CS. Thus, the dark current flowing out from the battery 20 can be reduced to be smaller than that in the conventional circuit in FIG. 3. Moreover, the detection voltage adjustment circuit 14a has a simple configuration, and the number of elements to be added to the circuit is small, whereby increase in chip size of the IC can be suppressed.

The embodiment (including the modification example) of the present invention is described above, but the present invention is not limited to the foregoing embodiment. For example, in the voltage detection circuit 10 of the embodiment in FIG. 1, the MOS transistor M2 and the resistor $R_{f3}$ are provided in a subsequent stage of the differential amplifier AMP of the voltage-current conversion circuit 13. However, the MOS transistor M2 and the resistor $R_{f3}$ may be configured so as to be used as an output stage of the differential amplifier AMP.

In the above-described embodiment, the internal power supply voltage terminal Vcci to which the constant current source CS is connected, and power supply voltages of the voltage comparison circuit 12 and the differential amplifier AMP, are not specifically illustrated. However, the power supply voltages of these circuits may use the battery voltage $V_{BAT}$ that is input to the voltage input terminal VS, as it is, or a voltage that is generated by an internally provided regulator may be used as an internal power supply voltage.

In addition, the reference voltage $V_{REF}$, which is input to the voltage comparison circuit 12 in the voltage detection circuit 10 of the embodiment in FIG. 1, may be generated by providing a voltage reference circuit to the inside of the chip. Alternatively, an external terminal for inputting a reference voltage $V_{REF}$ may be provided to the IC, and an externally generated voltage may be input.

Moreover, bipolar transistors may be used instead of the MOS transistors M1 and M2. The resistor $R_{E1}$ may be incorporated, and rearrangement can be made without changing the configuration of the external parts in FIG. 3.

Although an application of the present invention to the battery voltage detection circuit for detecting the battery voltage is illustrated in the above-described embodiment, the present invention can be used in voltage detection circuits for detecting voltages other than battery voltages.

According to an aspect of the present invention, there is provided a voltage detection circuit including: a voltage input terminal to which a voltage of a monitoring target is input; a voltage dividing circuit that includes series resistors connected between the voltage input terminal and a constant voltage terminal; a voltage comparison circuit that compares a voltage divided by the voltage dividing circuit with a predetermined voltage; an output terminal from which a result of comparison by the voltage comparison circuit is output; a detection voltage adjustment terminal to which an external resistor is connected; a voltage-current conversion circuit that is provided between the detection voltage adjustment terminal and the voltage dividing circuit; and a constant current source that is connected between an internal power supply voltage terminal and the detection voltage adjustment terminal, and the voltage detection circuit is a semiconductor integrated circuit formed on a semiconductor substrate, and the voltage detection circuit detects that a voltage input to the voltage input terminal becomes over or below a predetermined voltage value and outputs a signal from the output terminal, and a detection voltage of the voltage input terminal is adjusted by the voltage-current conversion circuit drawing an electric current corresponding to a resistance value of the external resistor, which is connected to the detection voltage adjustment terminal, from a connection node between the series resistors of the voltage dividing circuit.

In the above-described configuration, a large current does not flow in the external resistor for adjusting the detection voltage. Thus, in the case where the voltage detection circuit is used in detecting a battery voltage, the detection voltage value can be adjusted by the external resistor without increasing a dark current of the battery. In addition, the dark current can be decreased, resulting in long life of the battery. Moreover, the effect of variations in the internal resistors on the detection voltage is suppressed, and therefore, the voltage can be detected with high accuracy.

Preferably, in the voltage detection circuit, the voltage-current conversion circuit includes: a transistor and a resistance element that are connected in series between the connection node between the series resistors of the voltage dividing circuit and a ground point; and a differential amplifier circuit that includes a first input terminal to which a voltage of the detection voltage adjustment terminal is input, and a second input terminal to which an electric potential at a connection node between the transistor and the resistance element is input, and an output of the differential amplifier circuit is applied to a control terminal of the transistor.

This configuration enables constructing the voltage-current conversion circuit with the use of a relatively small-sized simple circuit and thereby suppresses increase in consumption of current due to the added circuit. The voltage adjustment function is easily disabled only by performing a wiring and connecting process so that the ground potential is applied to the voltage adjustment terminal. Thus, the usability is good.

Preferably, in the voltage detection circuit, the voltage of the monitoring target is a voltage of a battery.

Preferably, in the voltage detection circuit, the battery is a battery that is mounted on a vehicle.

When the voltage detection circuit described above is used in detecting a battery voltage, the detection voltage value can be adjusted by the external resistor without increasing the dark current of the battery. As a result, it is not necessary to prepare multiple voltage detection ICs for different detection voltage values. Moreover, it is possible to provide a voltage detection circuit that detects a voltage value with high accuracy.

Although some embodiments of the present invention have been described and illustrated in detail, the disclosed embodiments are made for purposes of not limitation but illustration and example only. The scope of the present invention should be interpreted by terms of the appended claims.

What is claimed is:

1. A voltage detection circuit comprising:
   a voltage input terminal to which a voltage of a monitoring target is input;
   a voltage dividing circuit that includes series resistors connected between the voltage input terminal and a constant voltage terminal;
   a voltage comparison circuit that compares a voltage divided by the voltage dividing circuit with a predetermined voltage;
   an output terminal from which a result of comparison by the voltage comparison circuit is output;
   a detection voltage adjustment terminal to which an external resistor is connected;
   a voltage-current conversion circuit that is provided between the detection voltage adjustment terminal and the voltage dividing circuit; and
   a constant current source that is connected between an internal power supply voltage terminal and the detection voltage adjustment terminal, wherein
   the voltage detection circuit is a semiconductor integrated circuit formed on a semiconductor substrate, and the voltage detection circuit detects that a voltage input to the voltage input terminal becomes over or below a predetermined voltage value and outputs a signal from the output terminal, and a detection voltage of the voltage input terminal is adjusted by the voltage-current conversion circuit drawing an electric current corresponding to a resistance value of the external resistor, which is connected to the detection voltage adjustment terminal, from a connection node between the series resistors of the voltage dividing circuit.

2. The voltage detection circuit according to claim 1, wherein
the voltage-current conversion circuit includes:
a transistor and a resistance element that are connected in series between the connection node between the series resistors of the voltage dividing circuit and a ground point; and
a differential amplifier circuit that includes a first input terminal to which a voltage of the detection voltage adjustment terminal is input, and a second input terminal to which an electric potential at a connection node between the transistor and the resistance element is input, and
an output of the differential amplifier circuit is applied to a control terminal of the transistor.

3. The voltage detection circuit according to claim 1, wherein the voltage of the monitoring target is a voltage of a battery.

4. The voltage detection circuit according to claim 3, wherein the battery is a battery that is mounted on a vehicle.

* * * * *